US 6,557,128 B1

(12) United States Patent
Turnquist

(10) Patent No.: US 6,557,128 B1
(45) Date of Patent: Apr. 29, 2003

(54) SEMICONDUCTOR TEST SYSTEM SUPPORTING MULTIPLE VIRTUAL LOGIC TESTERS

(75) Inventor: James Alan Turnquist, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/439,864

(22) Filed: Nov. 12, 1999

(51) Int. Cl.[7] .................................................. G01R 31/28
(52) U.S. Cl. ....................................................... 714/724
(58) Field of Search ................................. 714/724, 733, 714/734, 735, 736, 738, 739, 740, 741, 742, 743, 744; 324/763, 764, 765, 158.1 R

(56) References Cited

U.S. PATENT DOCUMENTS 5,225,772 A * 7/1993 Cheung et al. ............. 324/73.1
5,835,506 A * 11/1998 Kuglin ....................... 714/738
6,092,225 A * 7/2000 Gruodis et al. ............. 714/724

* cited by examiner

Primary Examiner—Christine T. Tu
(74) Attorney, Agent, or Firm—Muramatsu & Associates

(57) ABSTRACT

A single semiconductor test system which behaves as multiple logic testers, each operating separately and asynchronously from the other. The semiconductor test system includes a host computer for controlling an overall operation of the test system by executing a test program, a plurality of pin-units each having means for generating a test pattern to an assigned pin of a semiconductor device under test (DUT) and evaluating a resultant response of the DUT, a pin-unit bus provided between said host computer and the plurality of pin-units for transmitting data, address, control signals and clocks, and means for configuring the pin-units corresponding to input/output pins of devices under test when a group selection address is placed on the pin-unit bus by the host computer.

16 Claims, 13 Drawing Sheets

Master Clock

Pin Bus Clock

Addr Enable

Write/Read

Data[n..1]

Reg Addr[n..1]

Card/Group Addr[n..1]

Card/Group Sel

Start Test

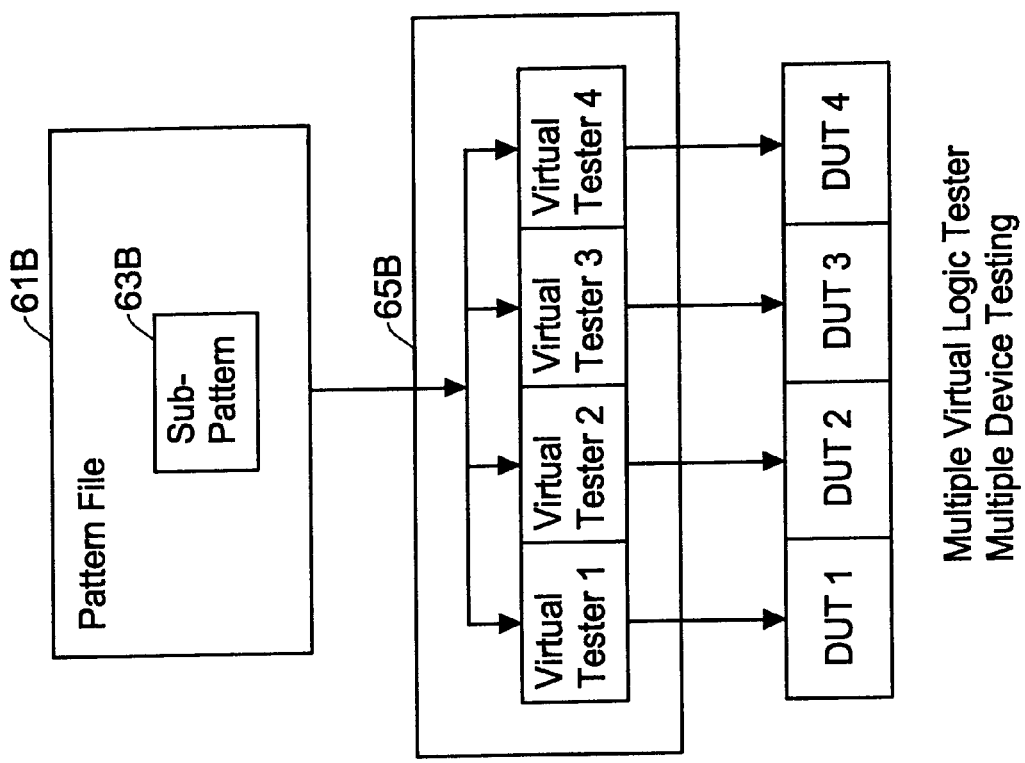
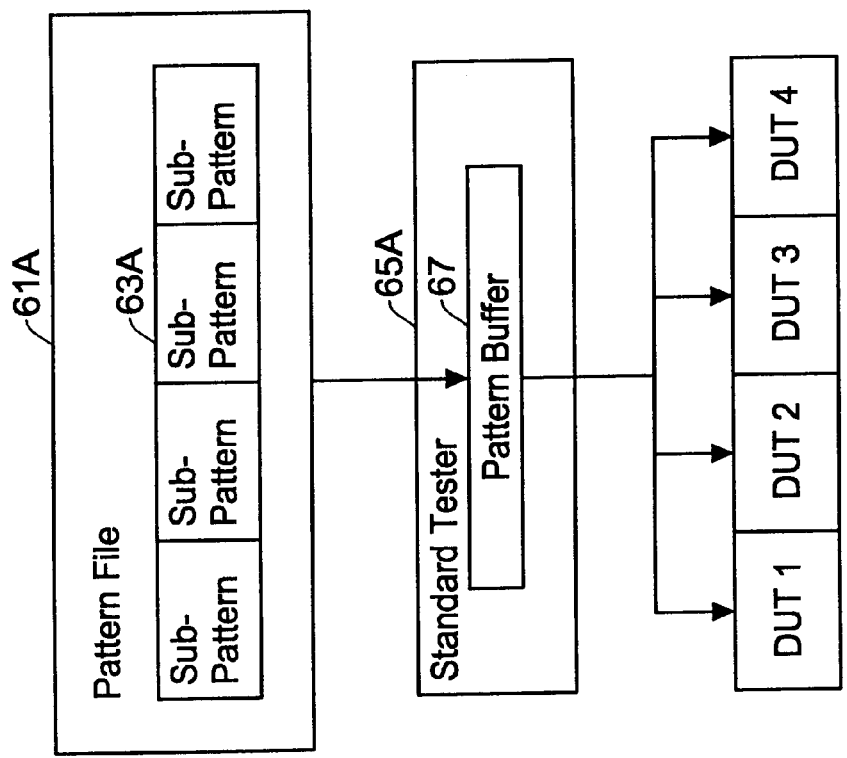

SEMICONDUCTOR TEST SYSTEM SUPPORTING MULTIPLE VIRTUAL LOGIC TESTERS

FIELD OF THE INVENTION

This invention relates to a semiconductor test system such as automatic test equipment (ATE) for testing semiconductor devices such as ICs and LSIs, and more particularly, to a single ATE system which behaves as multiple logic testers, each operating separately and asynchronously from the other, as well as a conventional single logic tester.

BACKGROUND OF THE INVENTION

In testing semiconductor devices such as ICs and LSIs by a semiconductor test system, such as automatic test equipment (ATE) or an IC tester, a semiconductor device to be tested is provided with test signals (patterns) at its appropriate pins with predetermined test timings. The semiconductor test system receives output signals from the device under test generated in response to the test signals. The output signals are sampled by strobe signals with specified timings to be compared with expected value signals to determine whether the semiconductor device under test performs the intended functions correctly or not.

FIG. 1 is a schematic block diagram showing an example of a conventional semiconductor test system. In the semiconductor test system of FIG. 1, a pattern generator 12 receives test data from a test processor 11. The pattern generator 12 generates a test pattern data to be provided to a wave formatter 14 and an expected value pattern to be provided to a pattern comparator 17. A timing generator 13 generates timing signals to synchronize the operation of the overall test system. In FIG. 1, the timing signals are provided, for example, to the pattern generator 12, the pattern comparator 17, the wave formatter 14, and an analog comparator 16.

The timing generator 13 also provides a test cycle (tester rate) pulse and timing data to the wave formatter 14. The pattern (test vector) data defines "0" and "1", i.e., rising and falling edges of the test signal waveform. The timing data (timing set data) defines timings (delay times) of the rising and falling edges of the waveform relative to the test cycle pulse. Typically, the timing data also includes waveform information such as an RZ (return to zero), NRZ (non-return to zero) or EOR (exclusive OR) waveform.

Based on the pattern data from the pattern generator 12 and the test cycle pulse and timing data from the timing generator 13, the wave formatter 14 forms a test signal having specified waveforms and timings. The wave formatter 14 sends the test signal to the DUT 19 through a driver 15. The wave formatter 4 includes set/reset flip-flops (not shown) to form the test signal to be provided to the driver 15. The driver 15 regulates the amplitude, impedance, and/or slew rate of the test signal and applies the test signal to the DUT 19.

A response signal from the DUT 19 is compared with a reference voltage at a predetermined strobe timing by the analog comparator 16. The resultant logic signal is provided to the pattern comparator 17 wherein a logic comparison is performed between the resultant logic pattern from the analog comparator 16 and the expected value pattern from the pattern generator 12. The pattern comparator 17 checks whether two patterns match with each other or not, thereby determining pass or failure of the DUT 19. When a failure is detected, such failure information is provided to a fail memory 18 and is stored along with the information of the failure address of the DUT 19 from the pattern generator 12 in order to perform failure analysis.

In the conventional test system, however, either in the per-pin or pin cluster architecture, the test pins are treated as a single group of pins that start and run together until the completion of the test program. In other words, these conventional test systems perform the parallel testing by duplicating the same test pattern across a single pattern memory. Thus, the above noted operation has the restriction that each device is running the same test pattern and the pattern on each device must run to completion even when an error in one of the DUTs is detected.

A pin-cluster tester refers to a semiconductor test system wherein tester resources such as a timing generator and reference voltages are commonly used for all or predetermined number of test channels (test pins). An IC tester having the shared resource (cluster-pin) structure such as shown in FIG. 1 is considered economical but not flexible enough to test recent IC devices with high complexity and high speed. Compared to the shared resource tester that shares the test parameters for each terminal pin of the DUT, the per-pin tester is better suited for testing high speed LSIs since a complex test pattern and timing can be generated more freely since it can produce the test parameters for each terminal pin of the DUT independently from the other pins. In a typical per-pin IC tester, the timing generator 13 and wave formatter 14 in FIG. 1 are separately provided to each test pin, i.e., to each terminal pin of the DUT.

In the semiconductor test industry, there is a need to test multiple devices in parallel to improve test efficiency. There are semiconductor test systems that can test multiple devices in parallel. FIGS. 2A and 2B show examples of basic configuration for testing a plurality of semiconductor devices at the same time. In FIG. 2A, two test heads TH1 and TH2 are connected to automatic test equipment (ATE) 10 to test two devices DUT1 and DUT2 in parallel. In FIG. 2B, two devices DUT1 and DUT2 are tested on a single test head TH connected to the ATE 10.

In the conventional test system, however, either in the per-pin or pin cluster architecture, the test pins are treated as a single group of pins that start and run together until the completion of the test program. In other words, these conventional test systems perform the parallel testing by duplicating the same test pattern across a single pattern memory. Thus, the above noted operation has the restriction that each device is running the same test pattern and the pattern on each device must run to completion even when an error in one of the DUTs is detected.

SUMMARY OF THE INVENTION

Therefore, it is an object of the present invention to provide a semiconductor test system which functions as multiple logic testers where each logic tester operates independently and asynchronously from the other.

It is another object of the present invention to provide a semiconductor test system which behaves as multiple logic testers where each logic tester is freely configured in terms of test pins corresponding to requirements of a semiconductor device to be tested.

It is a further object of the present invention to provide a semiconductor test system which is capable of conducting either synchronous or asynchronous parallel testing on multiple devices.

It is a further object of the present invention to provide a semiconductor test system which is capable of running a plurality of test programs in parallel and simplifying software programming for multiple device parallel testing.

It is a further object of the present invention to provide a semiconductor test system which supports virtual multiple logic testers with low cost and high test flexibility and test efficiency.

According to the present invention, the semiconductor test system is comprised of a host computer controlling an overall operation of a semiconductor test system by executing a test program, a plurality of pin-units each having means for generating a test pattern to a assigned pin of a semiconductor device under test (DUT) and evaluating a resultant response of the DUT, a pin-unit bus provided between said host computer and the plurality of pin-units for transmitting data, address, control signals and clocks, and means for configuring the pin-units corresponding to input/output pins of devices under test when a single or group selection address is placed on the pin-unit bus by the host computer.

In the test system of the present invention which supports multiple virtual testers, groups of test pins are dynamically allocated to separate devices under test (DUTs) or separate subsystems of system-on-a-chip (SoC). These groups are addressed by the tester hardware separately and treated as discrete individual test systems. The group allocation and selection is accomplished through a hardware mechanism that allows the host computer to write the group selection address (GSA) on the pin-unit bus. Tests running on these virtual testers can be started together or separately and end independently. Thus, the present invention allows to test a plurality of different IC devices simultaneously on a single test system. The concept of the present invention is applicable to either the tester per-pin architecture or the pin-cluster architecture.

BRIEF DESCRIPTION OF THE DRAWINGS

FIGS. 7A and 7B schematic diagram showing pattern file layouts and pattern loading flows for the conventional semiconductor test system and the multiple virtual testers of the present invention.

DETAILED DESCRIPTION OF THE PREFERRED EMBODIMENTS

Figure 3:
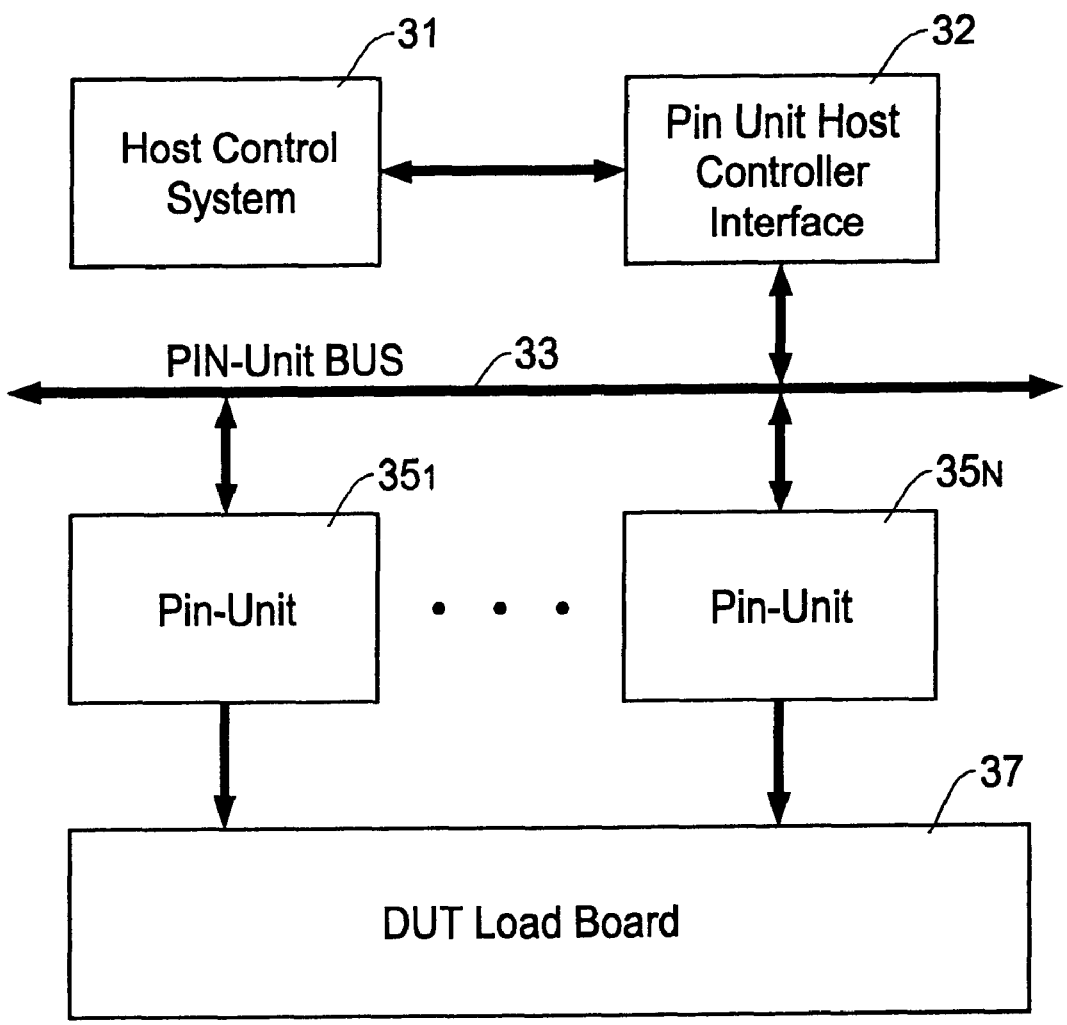
FIG. 3 is a schematic diagram showing a basic structure of a semiconductor test system of the present invention which supports multiple virtual logic testers for testing a plurality of different devices in parallel.

The basic configuration of the semiconductor test system of the present invention is shown in FIG. 3 which supports multiple virtual logic testers. The multiple virtual testers in this invention can be defined as a single ATE (automatic test equipment) system running a number of test programs simultaneously through use of special test group controlling hardware. The example of FIG. 3 includes a host control system (system main computer or host computer) 31, a pin-unit/host controller interface 32, a pin-unit bus 33, a plurality of pin-units $35_1$–$35_N$, and a DUT load board 37.

Main tasks of the host control system 31 are to run the user test programs and translate the test programs into tester bus data that configures and runs the pin-units and retrieves test results. The host control system can be a single computer or interconnected network of computers, each supporting software that controls the test system. For example one computer, a workstation or personal computer may control the user interface and may be connected to another computer controlling the real-time functions required to operate the test system hardware.

The pin-unit/system controller interface 32 interfaces the host control system 31 to the pin-unit bus 33. The pin-unit/system controller interface 32 takes one of two forms. (1) It could be a host card and target bus card connected via a flexible cable supporting serial or parallel communication protocol. (2) It could be an interface card connecting two disparate buses on a single system backplane.

The pin-unit/system controller interface 32 allows the host control system 31 to write configure and control data to the pin-units $35_1$–$35_N$ individually or in programmable groups. A programmable group is defined as hardware mechanism that allows the host control system 31 to write a data group selection address (GSA) to a program group selection address register on a target pin-unit 35. When a specific group selection address is placed on the address bus with the proper group qualifiers and a destination register address, the bus data is written to the target registers of all pin-units $35_1$–$35_N$ matching that GSA group data. Such a function is performed by a pin-unit data write decoder 53 shown in FIG. 4 in each pin-unit 35, as will be described in more detail later.

A pin-unit 35 is to generate a test pattern for the allocated test pin and evaluate the resultant response of the DUT (device under test) pin. A pin-unit 35 is mapped to a virtual test unit allocated from a group of tester pin unit boards (such as 64–256) each of which can generate a test pattern for a corresponding DUT pin and evaluate the resultant response therefrom. In the present invention, such pin-unit allocation is freely and dynamically reconfigured under the control of the host control system 31.

High level functions that are generally performed on a pin-unit 35 are such things as, (1) read end of test status, (2) load test pattern, (3) start test pattern, (4) read pattern fail addresses, and (5) configure pin-units. In principle, these are the same functions that are used in present day ATE systems. These functions can be applied to subsections or groups of pins that represent a virtual tester. The pin-units 35 may have micro-controllers that handle some of or parts of these functions locally to simplify and speed processing.

The virtual tester technology can be applied to both a cycle based tester or an event based tester. In a traditional cycle based tester, a test pattern is produced based on test data including test rate, delay timing, waveform and vector descriptions. In an event based tester, which is a new concept of tester structure, a test pattern is produced based on value change and timing information. The detailed description regarding the event based test system is given in U.S. patent application Ser. No. 09/406,300 owned by the same assignee of this invention.

As noted above, the host control system 31 functions as a user interface with the pin-units $35_1$–$35_N$. The host control system 31 enables a user to instruct the start and stop operation of the test, to load a test program and other test conditions, or to perform test result analysis. The host control system 31 interfaces with the pin-units $35_1$–$35_N$ through the pin-unit bus 33. As briefly noted above, the host control system 31 configures and assigns the pin-units 35 by transmitting the group select address to the pin-unit write decoder 53 in each pin-unit 35.

Figure 4:
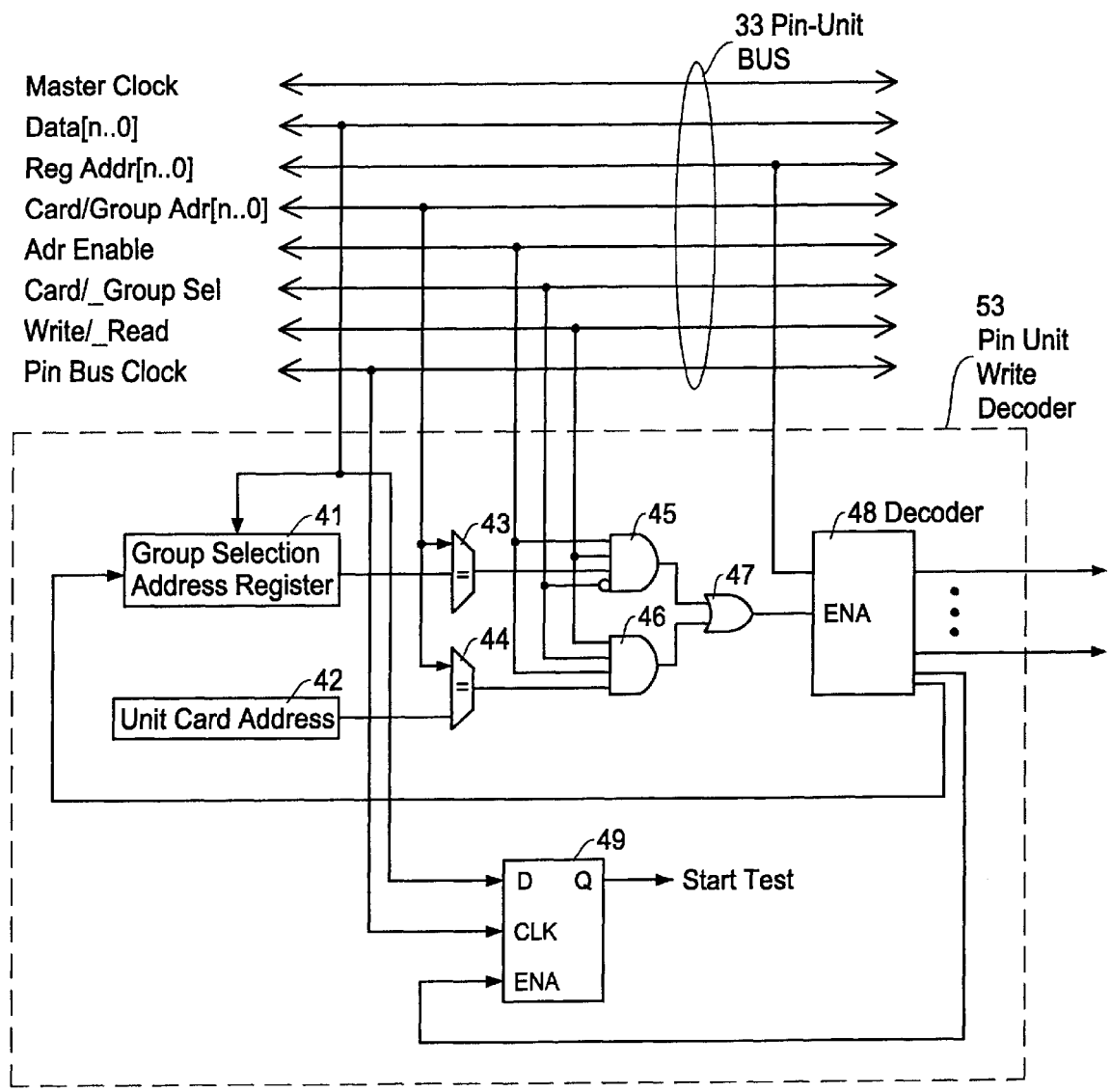
FIG. 4 is a circuit diagram showing an example of structure in a pin-unit write decoder provided in each pin-unit of the semiconductor test system of FIG. 3 to assign pin-units when receiving group address selection data.

FIG. 4 shows a circuit example of the pin-unit write decoder 53. The pin-unit write decoder is designed to allow the host control system 31 to register write to a single pin unit or multiple pin units simultaneously as a group. In the present invention, virtual tester control operations are efficiently implemented using the group register write functionality. Preferably, the pin-unit write decoder 53 is provided in each pin-unit 35. The purpose of the pin-unit write decoder 53 is to detect the group selection data and register address data from the host control system 31 and to allow instructions and data to reach inner registers of the designated pin-units 35. FIG. 4 also shows signal lines of the pin unit bus 33 for transmitting control signals, address data, clocks, and etc.

In the example of FIG. 4, the pin-unit write decoder 53 includes a group selection address register 41, a unit card address set 42, comparators 43 and 44, AND gates 45 and 46, an OR gate 47, a decoder 48, and a flip-flop 49. An example of signals and data on the pin-unit bus 33 includes a master (system) clock, data, register address, card/group address, an address enable signal, a card/group select signal, a write/read select signal, and a pin bus clock. It should be noted that there are many ways to implement the present invention, and the configuration of FIG. 4 is one example shown for an illustrative purpose only.

In achieving the direct pin-unit selection (group write operation), the address lines contain the pin-unit address (card/group address) and the pin-unit target internal register address from the host control system 31. The data lines contain the data to be written to or read from the target registers. Here, the target register is a register (not shown) which is internally provided in every pin-unit for the purpose of data transfer. The read/write signal, card/group select signal and address enable signal are driven by the host system control 31 to tell the pin-units 35 to perform the commanded transaction.

More specifically, in the block diagram of FIG. 4 and timing diagrams of FIG. 5, the host control system 31 places the data Di (FIG. 5E) on the data lines, and the card/group address GAi (FIG. 5G) and the pin-unit target internal register address RAi (FIG. 5F) on the address lines. The data Di is to be transferred to the target register in the selected pin-unit 35. The card/group address GAi indicates a target group identification number.

When the group identifier in the register 41 matches the card/group address, the comparator 43 issues a match signal. Alternatively, when the address in the unit card address set 42 matches the card/group address, the comparator 44 issues a match signal. The address in the unit card address 42 is set by switches or special auto configuration process to uniquely identify the pin-unit. The match signals from the comparators 43 and 44 are mutually exclusive by the AND gates 45 and 46. The OR gate 47 provides an enable signal to the decoder 48, thereby sending the decoded register address to the target register.

Figure 5A:
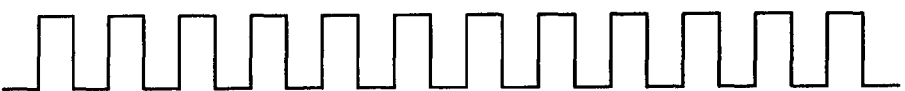
FIGS. 5A–5I are timing charts showing an operation involved in the pin-unit group decoder of FIG. 4 for selecting pin-units and generating a test start signal.
Figure 5B:
Figure 5C:
Figure 5D:
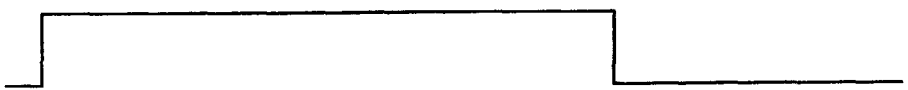
Figure 5E:
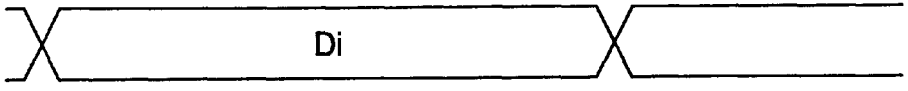
Figure 5F:
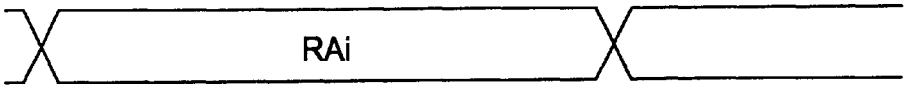
Figure 5G:
Figure 5H:
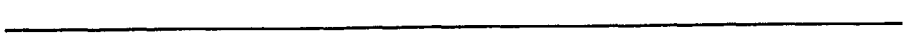
Figure 5I:

Both of the AND gates 45 and 46 are also provided with the control signals, i.e., the address enable signal (FIG. 5C), card/group select signal (FIG. 5H), and write/read select signal. In the group write operation, the write/read select signal is set high (FIG. 5D) to indicate a write operation, and the card/group select signal is set low to indicate the group write operation. The host control system 31 sequences the address enable signal from low to high and then from high to low (FIG. 5C) with the timing of the pin bus clock (FIG. 5B). Thus, at the completion of the sequence, every pin-unit internal register addressed by the register address RAi, the data Di is stored if the pin-unit has a register matching with the value indicated in the card/group address GAi.

One key function of the group data write is the ability to send a synchronized "start test" signal to a virtual tester group. The pin-units 35 in the virtual tester group all start testing on the same system master clock edge. One general aspect of ATE systems is that there is a master system clock from which all system timing is derived. When the target register is specified by the decoder 48, an enable signal is provided to the flip-flop 49, thereby generating a start test signal as shown in the timing diagram of FIG. 5I and the circuit diagram of FIG. 4 at the timing of the next pin bus clock.

Figure 6:
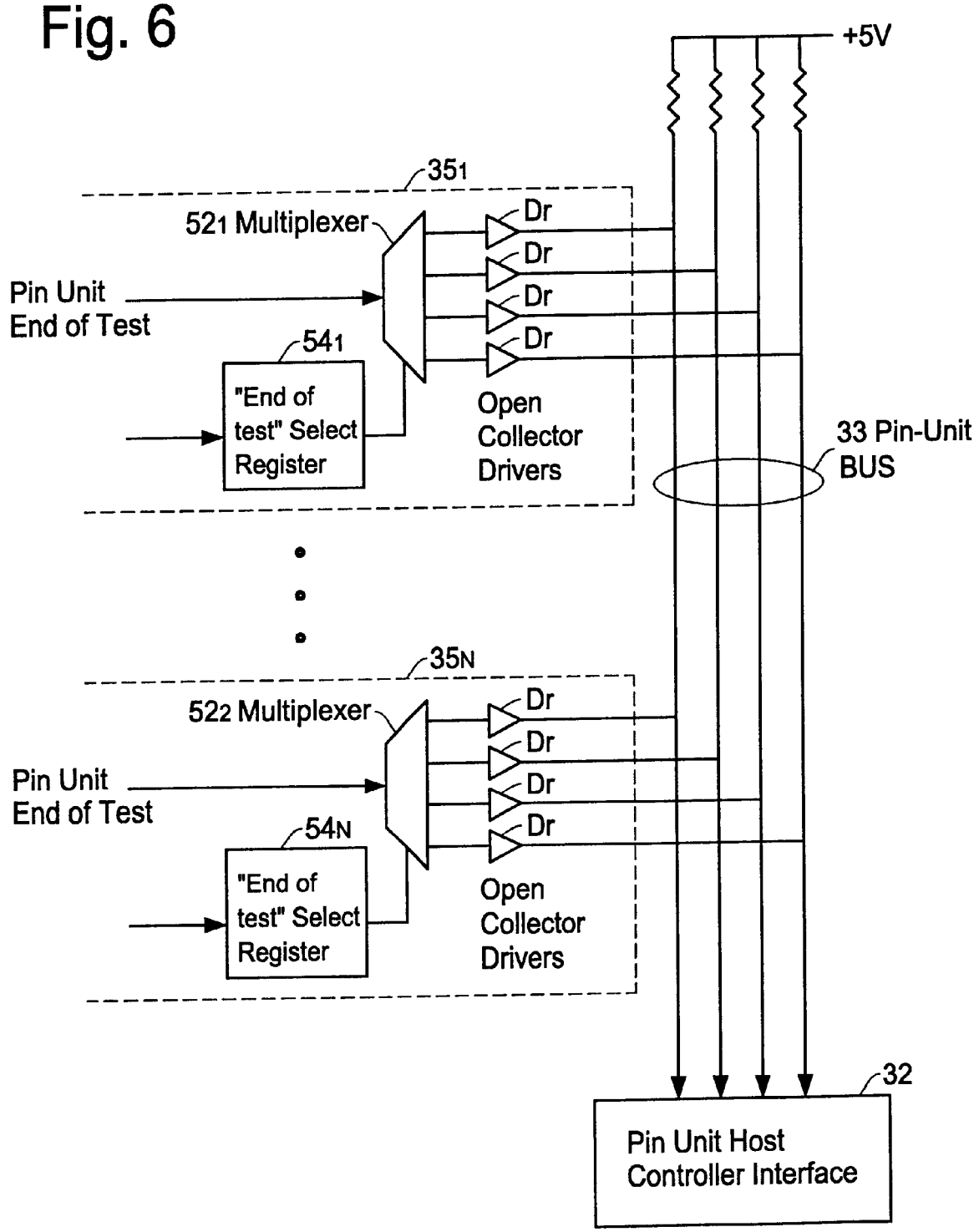
FIG. 6 is a circuit diagram showing an example of implementation for providing an end of test signal with respect to each pin-unit in the multiple virtual testers of the present invention.

One of the features of the present invention is a capability of independently generating an end of test signal from a pin-unit 35 that propagates to the pin-bus to end the test assigned to the pin-unit 35 while the test assigned to the other pin-units 35 is unaffected. The host control system 31 detects the end of test signal and may proceed to a new test for the pin-units 35 that were associated with the end of test signal. FIG. 6 shows an example of circuit diagram for implementing such a capability of detecting the end of test signal.

Minimally, the end of test can occur due end of the test pattern or from the detection of an unexpected output from the device under test. Conventionally, the end of test signal is monitored by the controlling host computer. Upon the detection of the active "end of test" signal, the host computer retrieves and processes the test result from the tester hardware.

In the present invention where the multiple virtual testers operate in parallel, there is the need to detect multiple "end of test" signals that can be monitored by the host control system 31. In the example of FIG. 6, the pin-unit bus 33 includes multiple "end of test" signals that can be dynamically assigned to a virtual tester group. Within a virtual tester group, each pin-unit must have the capability of asserting "end of test" on the assigned signal line of the pin-unit bus 33.

This can be accomplished by using a standard wired "OR" arrangement of the pin-units 35 to the "end of test" signal. Therefore, in the example of FIG. 6, each of the pin-units $35_1$–$35_N$ includes a multiplexer 52, a select register 54 and open collector drivers Dr. Due to the detection of an error, for example, an end of test signal is provided to the multiplexer 52 which is selected by the data from the select register 54. Thus, the end of test signal is transferred to the pin-unit bus 33 and thus to the host control system 31 through the selected open collector driver Dr.

The virtual tester technology for multiple DUT logic testing allows each virtual tester to run either synchronously or asynchronously to every other virtual tester. Each virtual tester has its own copy of the test pattern running separately from all others. There is a benefit that disc storage of virtual test patterns for multiple devices is approximately N times smaller than its standard ATE pattern counterpart. The reason for such memory reduction is briefly explained in the following with reference to FIGS. 7A and 7B.

This reduction of the disc storage comes from the fact that in a standard ATE system for testing multiple devices in parallel such as shown in FIG. 7A, one sub-pattern 63A is repeatedly multiplied in a single pattern file 61A. The sub-pattern 63A is the test pattern required to test a single device. Thus, the overall size of the file can be calculated by as the size of the sub-pattern (SP) times the number of times the pattern is repeated (PR), which is equal to SP×PR. In the virtual tester such as shown in FIG. 7B, however, the sub-pattern file 63B or the pattern to test a single device is reused and loaded into each virtual tester. Thus, the size of the total pattern file 61B is the size of the sub-pattern file 63B.

The test pattern in the conventional ATE system for multiple (parallel) DUT logic testing is made up of a horizontally repeated test pattern of the target device. This has the restriction that the test pattern must run in parallel and synchronously on all devices at once. The restriction of synchronous only operation is that it does not allow devices that have already been found divergent to move other parts of the test pattern while any one of the other DUTs is still being tested. In the present invention, however, by detecting the end of test signal for the corresponding pin-units that compose a virtual tester, the DUT is replaced with a new one and a new test is initiated separately from the other virtual tester instances.

Primarily, the asynchronously parallel testing reduces the overall test time. In asynchronous testing, each DUT testing task is allowed to move at its maximum speed and is not required to wait to run its test patterns synchronously (as in synchronous testing) with the other devices being tested. Synchronous testing requires scheduling of re-synchronization, which leads to longer overall test time.

Figure 8:
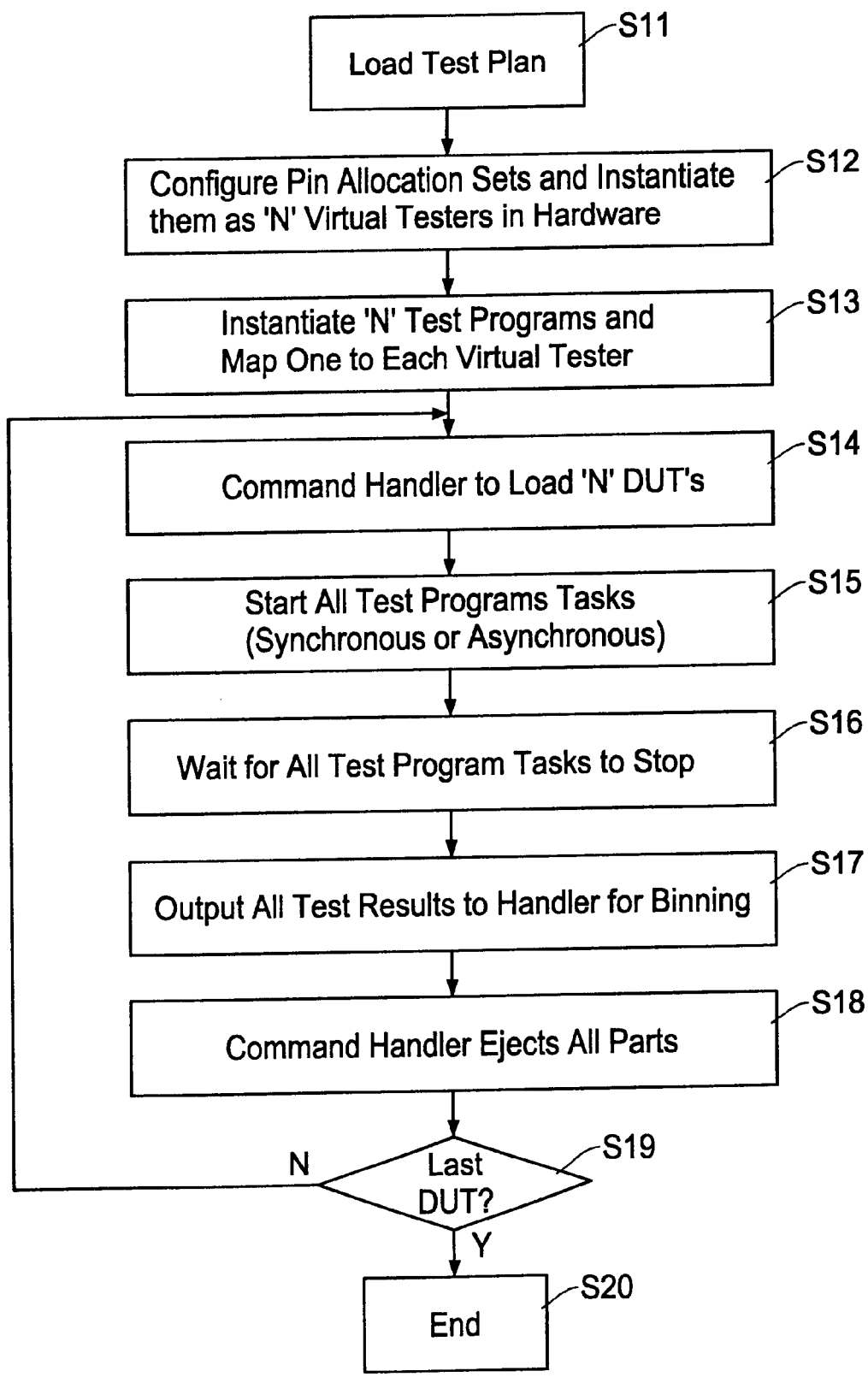
FIG. 8 is a flow chart showing an operation of parallel testing in the semiconductor test system of the present invention using a single test head.
Figure 9:
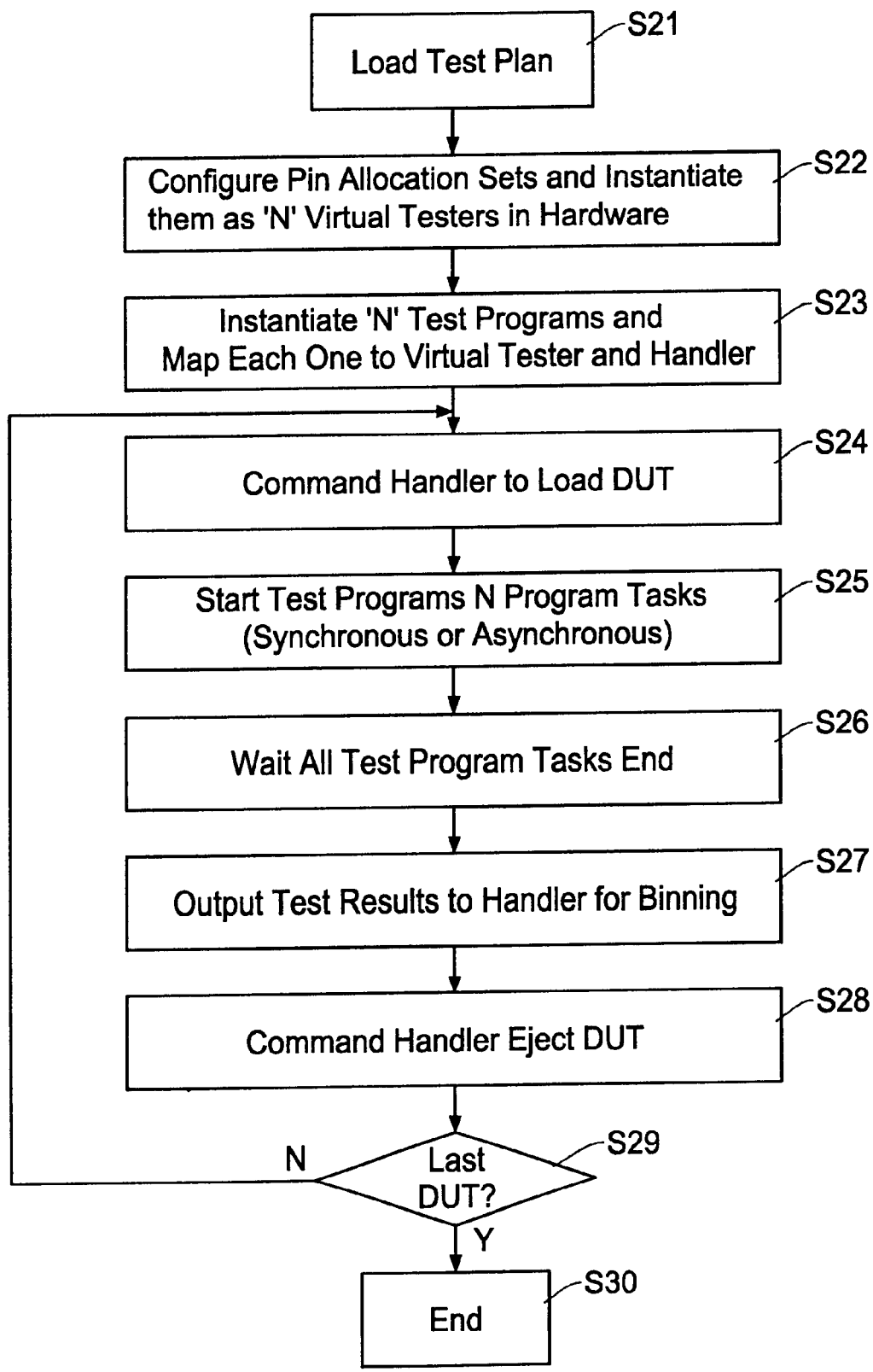
FIG. 9 is a flow chart showing an operation of parallel testing in the semiconductor test system of the present invention using two or more test heads.

FIGS. 8 and 9 show flow diagrams in the multiple DUT testing in the multiple virtual logic tester of the present invention. On the conventional ATE logic test system, there is no simple scheduling algorithm to implement parallel testing, each test program is customized to the device to be tested and associated test patterns. On the semiconductor test system of the present invention which supports multiple testing, the parallel testing of devices on a batch loaded handler such as shown in FIG. 2B can easily be accomplished using the simple algorithm. An example of such algorithms is shown in the flow diagram of FIG. 8.

In the first step S11, a test plan is loaded in the test system. The test plan indicates "N DUTs" to be tested in parallel. In the step S12, the system configures pin allocation sets and instantiates the pin allocation as "N" virtual testers in hardware. Then the process goes to the step S13 to instantiate "N" test programs and map each one to each virtual tester. In the step S14, the process commands a test handler to load N DUTs. In the step S15, all test programs tasks start either synchronously or asynchronously. In this step, the selected pin-units supply test patterns to DUTs in parallel and evaluate response outputs from DUTs.

In the step S16, the process waits for all of the test program tasks stop. When all the test program tasks stop for DUTs on the test handler, the system outputs all test results to the test handler for binning in the step S17. Thus, the tested DUTs are sorted according to the test results. In the step S18, the process commands the test handler to eject DUTs from the test heads. In the step S19, it is determined whether the tested semiconductor device is the last DUT. If the tested device is the last DUT, the process ends in the step S20, and if it is not the last DUT, the process goes back to the step S14 to repeat the procedure in the steps S14–S19 until all of the semiconductor devices are tested.

Figure 1:
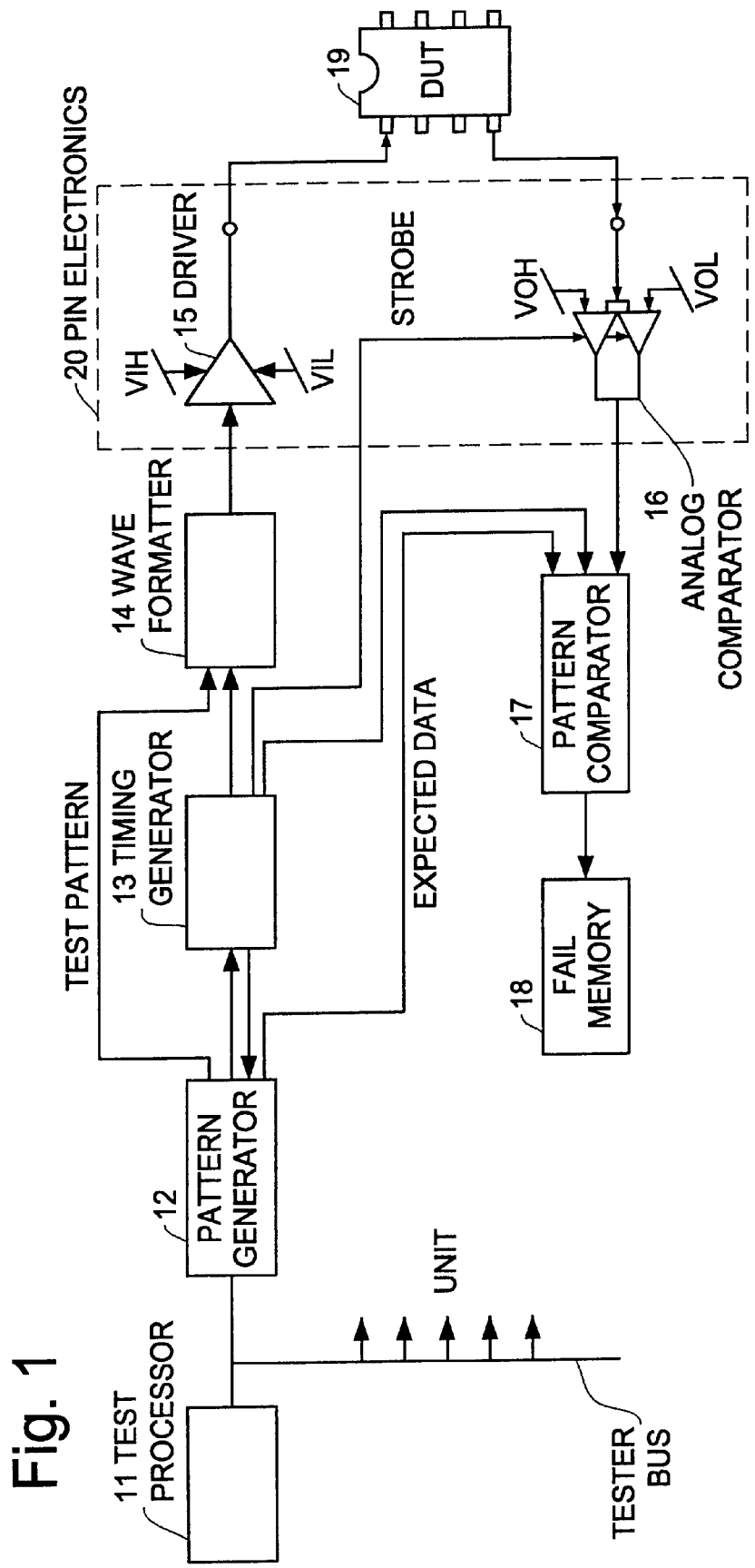
FIG. 1 a schematic block diagram showing an example of structure in a conventional semiconductor test system which generates test signals and test strobes based on test data described in a cycle base.
Figure 2A:
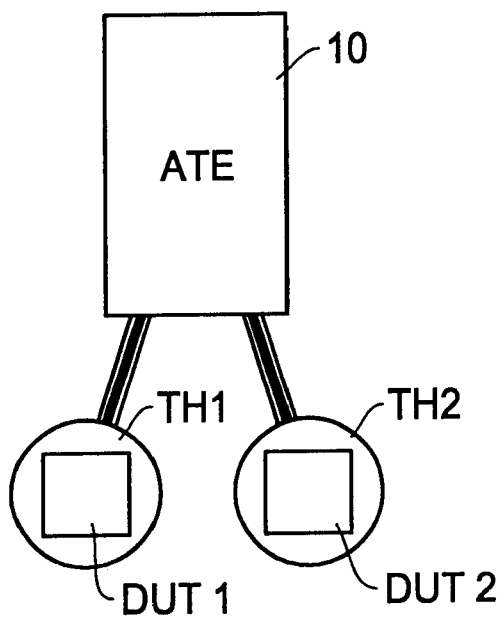
FIGS. 2A and 2B are schematic diagrams showing basic configurations for testing a plurality of IC devices under test (DUTs) in parallel by a semiconductor test system.
Figure 2B:
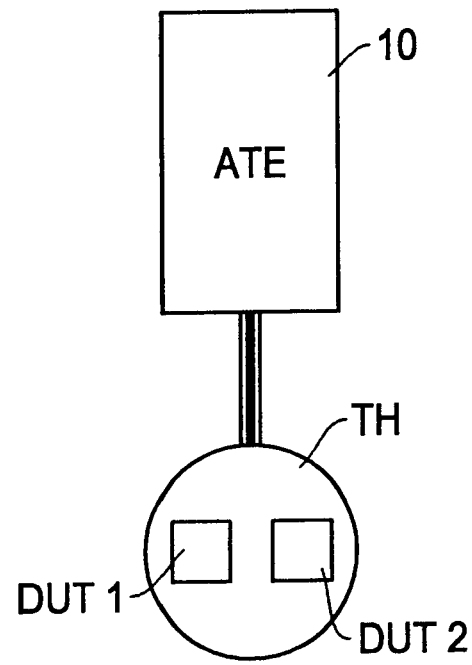

On the semiconductor test system of the present invention supporting multiple testing, the parallel testing of devices on multiple single DUT handlers such as shown in FIG. 2A can easily be accomplished using the simple algorithm. An example of such algorithms is shown in the flow diagram of FIG. 9.

In the first step S21, a test plan is loaded in the test system. The test plan indicates "N DUTs" to be tested in parallel. The test plan also indicates test handlers to map DUTs. In the step S22, the process configures pin allocation sets and instantiates the pin allocation as "N" virtual testers in hardware. Then the process goes to the step S23 to instantiate "N" test programs and map each one to each virtual tester and test handler. In the step S24, the process commands the test handlers to load N DUTs. In the step S25, all test programs tasks start either synchronously or asynchronously. In this step, the selected pin-units supply test patterns to DUTs in parallel and evaluate response outputs from DUTs.

In the step S26, the process waits for all of the test program tasks stop. When all the test program tasks stop for DUTs on the test handler, the process moves to the step S27 wherein the system outputs all test results to the test handlers, thereby DUTs being sorted according to the test results. In the step S28, the process commands the test handler to eject DUTs from the test heads. In the step S29, it is determined whether the tested semiconductor device is the last DUT. If the tested device is the last DUT, the process ends in the step S30, and if it is not the last DUT, the process goes back to the step S24 to repeat the procedure in the steps S24–S29 until all of the semiconductor devices are tested.

One approach to parallel testing SoC (system-on-a-ship) subsystems is similar to parallel testing of separate discrete logic devices, that is to applying the test signals sets to the cores in SoC device in parallel. Using the virtual tester capability of synchronous or asynchronous parallel, testing of SoC devices can easily be handled. Conventional test systems can apply synchronous test signals in parallel, but they can not apply test signals sets in parallel asynchronously. Two main advantages of asynchronous testing are, (1) some inter-subsystem operational problems will only be revealed in asynchronous testing, and (2) the overall test time of the device will be reduced because each test task is allowed to move at its maximum speed and is not usually required to resynchronize with the other subsystems being tested.

Figure 10:
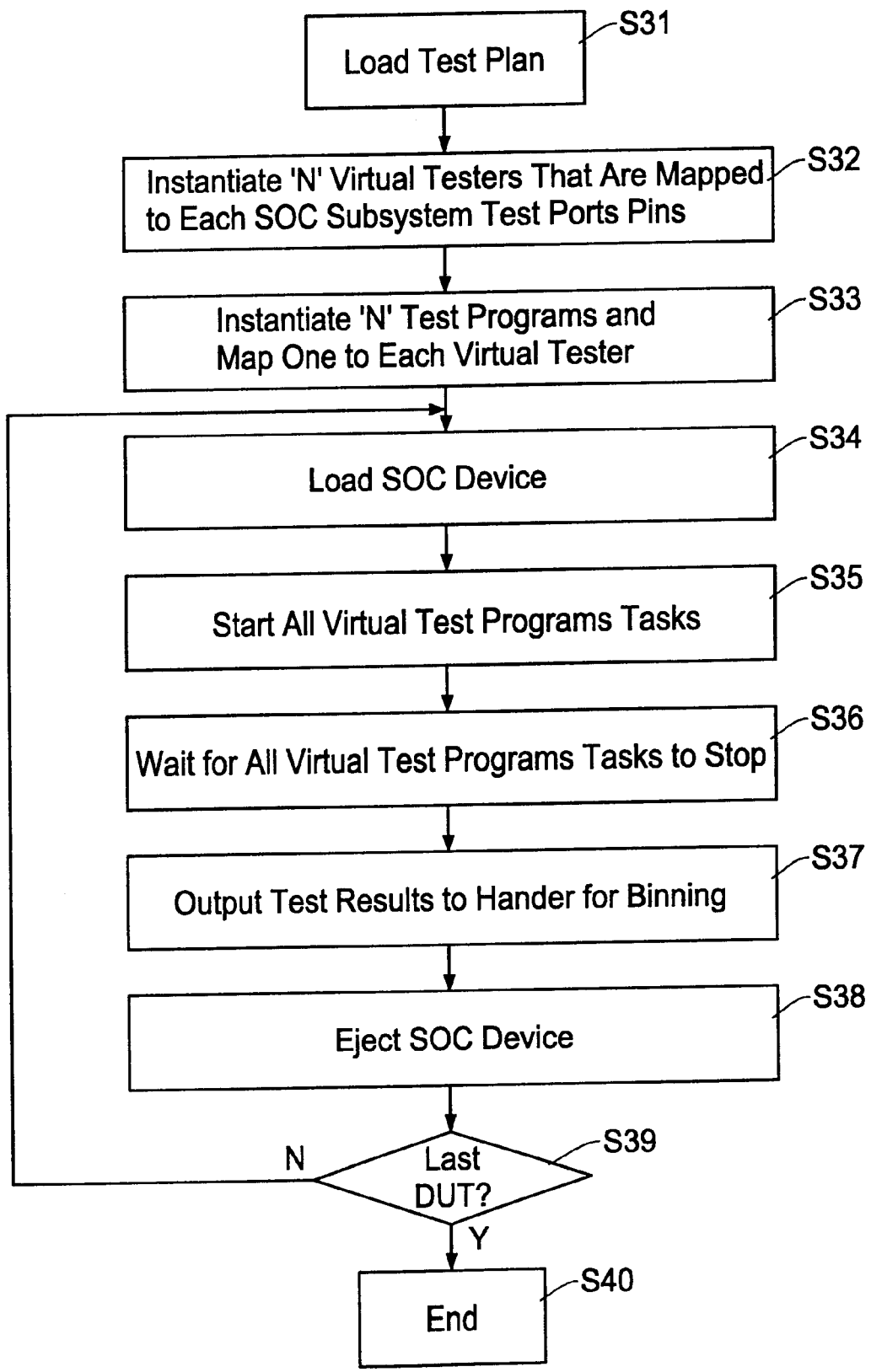
FIG. 10 is a flow chart showing an operation of parallel testing in the semiconductor test system of the present invention for testing functional cores in a system-on-a-chip (SoC) IC.

When asynchronously testing the SoC subsystems in parallel on virtual testers of the present invention, a simple algorithm such as shown in FIG. 10 could be used. At the start of the process in FIG. 10, a test plan is loaded in the test system in the step S31. The test plan indicates N SoC subsystems to be tested in parallel by N test programs. In the step S32, the process configures pin allocation sets and instantiates the pin allocation as "N" virtual testers and maps each virtual tester test port pins of each SoC subsystem. Then the process goes to the step S33 to instantiate "N" test programs and map each test program to each virtual tester. In the step S34, the process commands the test handlers to load SoC device. In the step S35, all test programs tasks start. In this step, the allocated virtual testers supply test patterns to SoC device in parallel and evaluate response outputs therefrom.

In the step S36, the process waits for all of the test program tasks stop. When all the test program tasks stop for SoC subsystems on the test handler, the process moves to the step S37 wherein the test system outputs all test results to the test handlers, thereby sorting SoC according to the test results. In the step S38, the process commands the test handler to eject SoC from the test head. In the step S39, it is determined whether the tested SoC is the last DUT. If the tested SoC is the last DUT, the process ends in the step S40, and if it is not the last DUT, the process goes back to the step S34 to repeat the procedure in the steps S34-S39 until all of the semiconductor devices are tested.

An advantage of this SoC approach using virtual testing is that the test program and patterns of each subsystem being tested is easily identified and isolated, instead of being buried in a concatenated pattern and test setups. This allows test engineers to easily develop and debug the subsystem test programs and test patterns of the SoC. Additionally this ability of isolation allows easy subsystem characterization.

Figure 11:
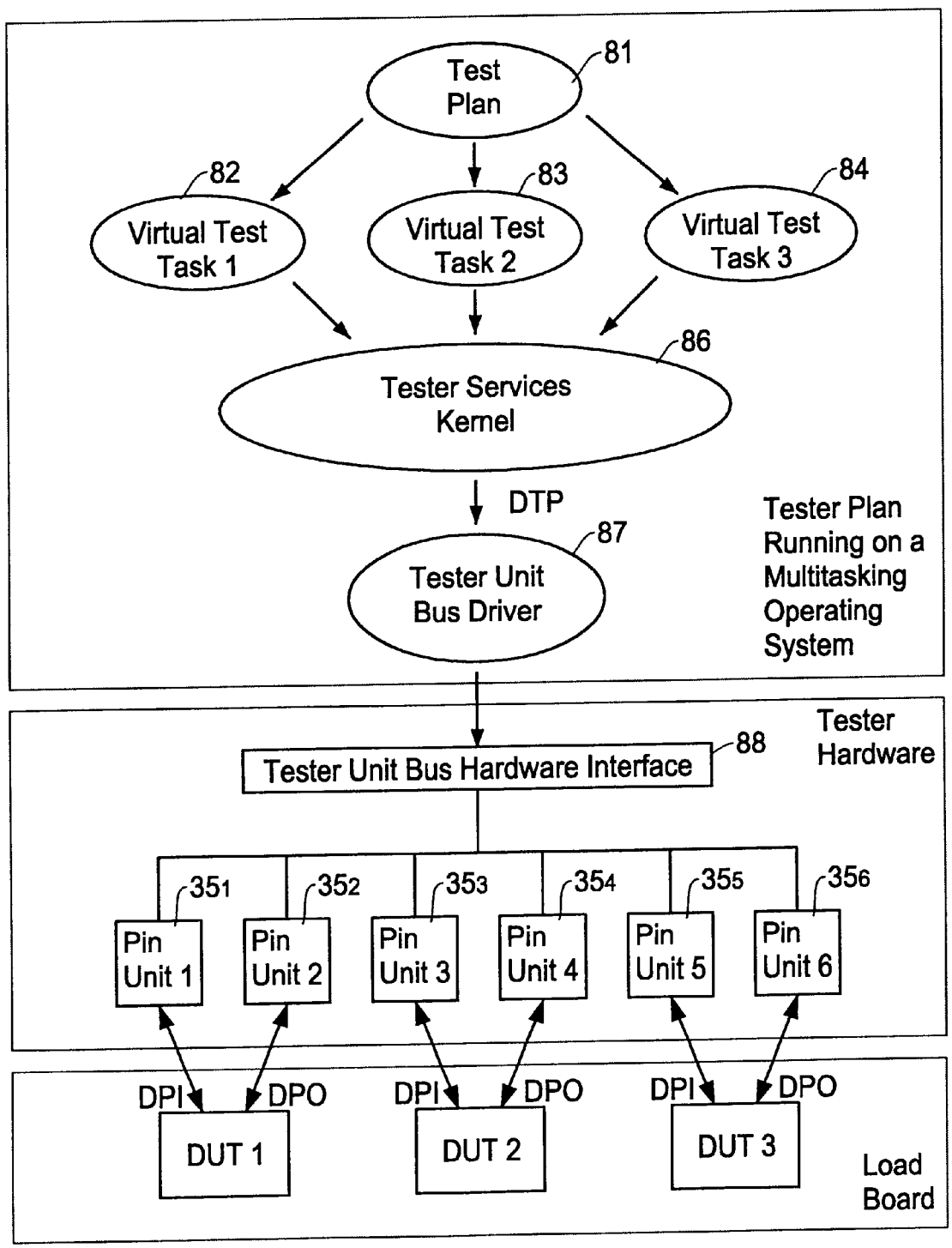
FIG. 11 is a block diagram showing an example of software/hardware structure of multiple virtual logic testers in the semiconductor test system of the present invention for testing three DUTs in parallel.

FIG. 11 shows an example of software and hardware block diagram of virtual tester system configured to test three DUTs in parallel. In this example software program task 82 (virtual test task VT1), 83 (virtual test task VT2) and 84 (virtual test task VT3) are instances of the same test program instantiated by "Test Plan" which is a main test program 81. In this example, it is assumed that, in the test program, there is only one test pattern DTP transmitted from the tester service kernel 86. It is also assumed that devices DUT1-3 have only two pins named DPI and DPO. The test pattern DTP contains the test sub-patterns for the individual test pins DPI and DPO, which is provided to pin-units 35$_1$–35$_6$ (Pin Units 1–6) via tester unit bus driver 87 and tester unit bus hardware interface 88.

Also referring to FIG. 12, an example of test plan process in the arrangement of FIG. 11 is as follows. In the step S51, the test plan is loaded in the test system. Then the process moves to the step S52 to configure task VT1 by getting pin unit handles RPDI and RPDO for the pin-units 1 and 2 from the tester services kernel 86. These handles RPDI and RPDO will be used by the virtual test task VT1 as its references to pins DPI and DPO of DUT1. In the step S53, the test sub-pattern DTP is loaded to pin-unit RPDI (pin-unit 1) for the pin DPI of the DUT1.

Then the process moves to the step S54 wherein the pin-units RPDI (pin-unit 1) and RPDO (pin-unit 2) are group mapped to virtual test group reference RVTGROUP. To create a virtual group, the system can use to control pin-unit groups that would create unique group selection address for each group. In the simplest case these are integer numbers allocated starting at 1 and incremented by one for each new group. This unique group number is written into the GSA (group selection address) register of the units that is desired to respond to for that group.

In the step S56, the system delivers the virtual test task VT1 with the references RPDI and RPDO for its test pins and RVTGROUP as its virtual test group. Then, it is determined whether the all the virtual test tasks are assigned in the step S57. If it is, the process ends in the step S59, and it is not, the process goes to the step S58 to repeat the steps S52–S57 for the tasks VT2–VT3, using DUT2–DUT3 and appropriate the pin-units 3–6.

Figure 12:
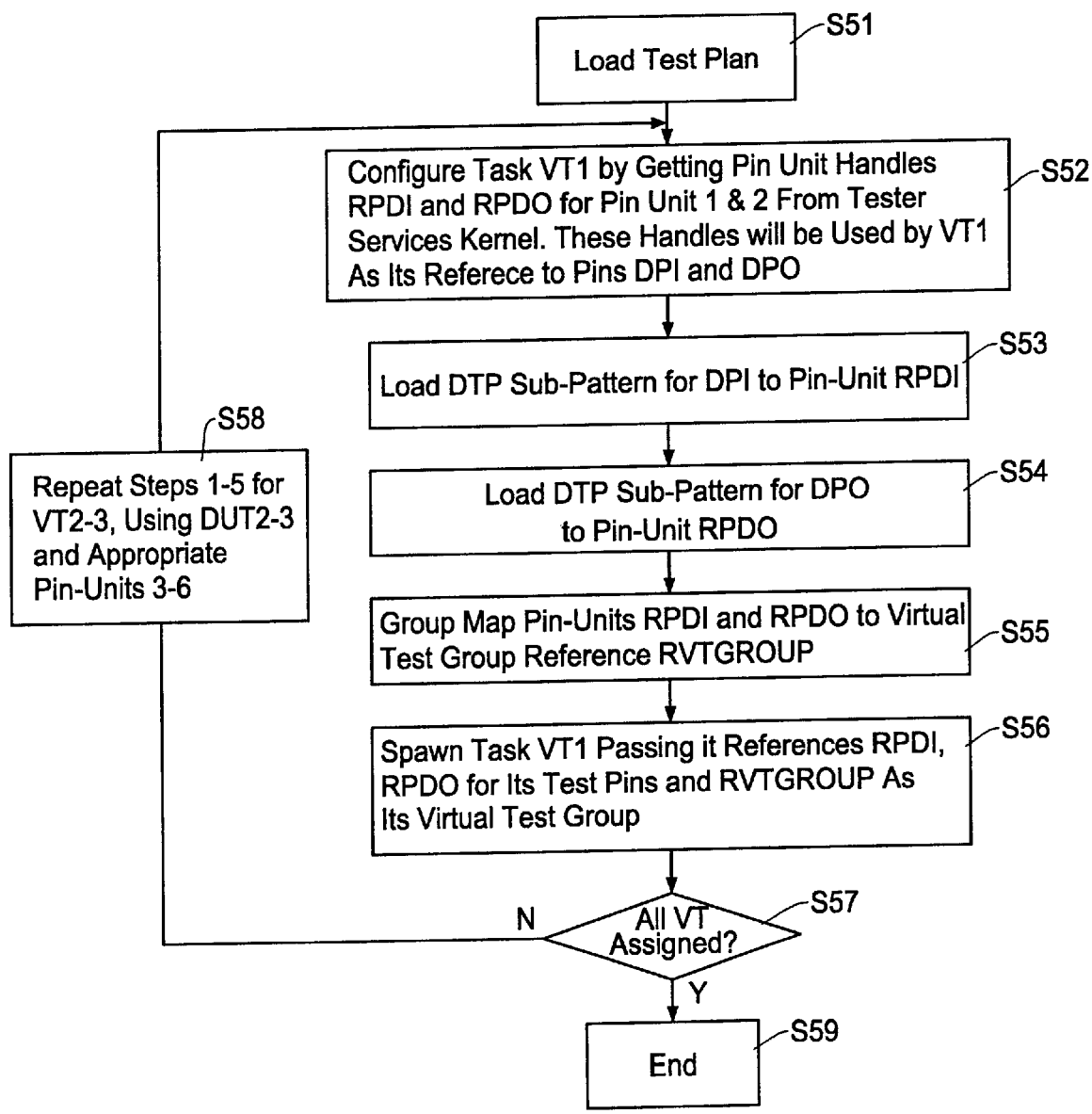
FIG. 12 is a flow chart showing a procedure for assigning a group of virtual logic testers prior to the parallel testing of FIG. 10 by the semiconductor test system of the present invention.
Figure 13:
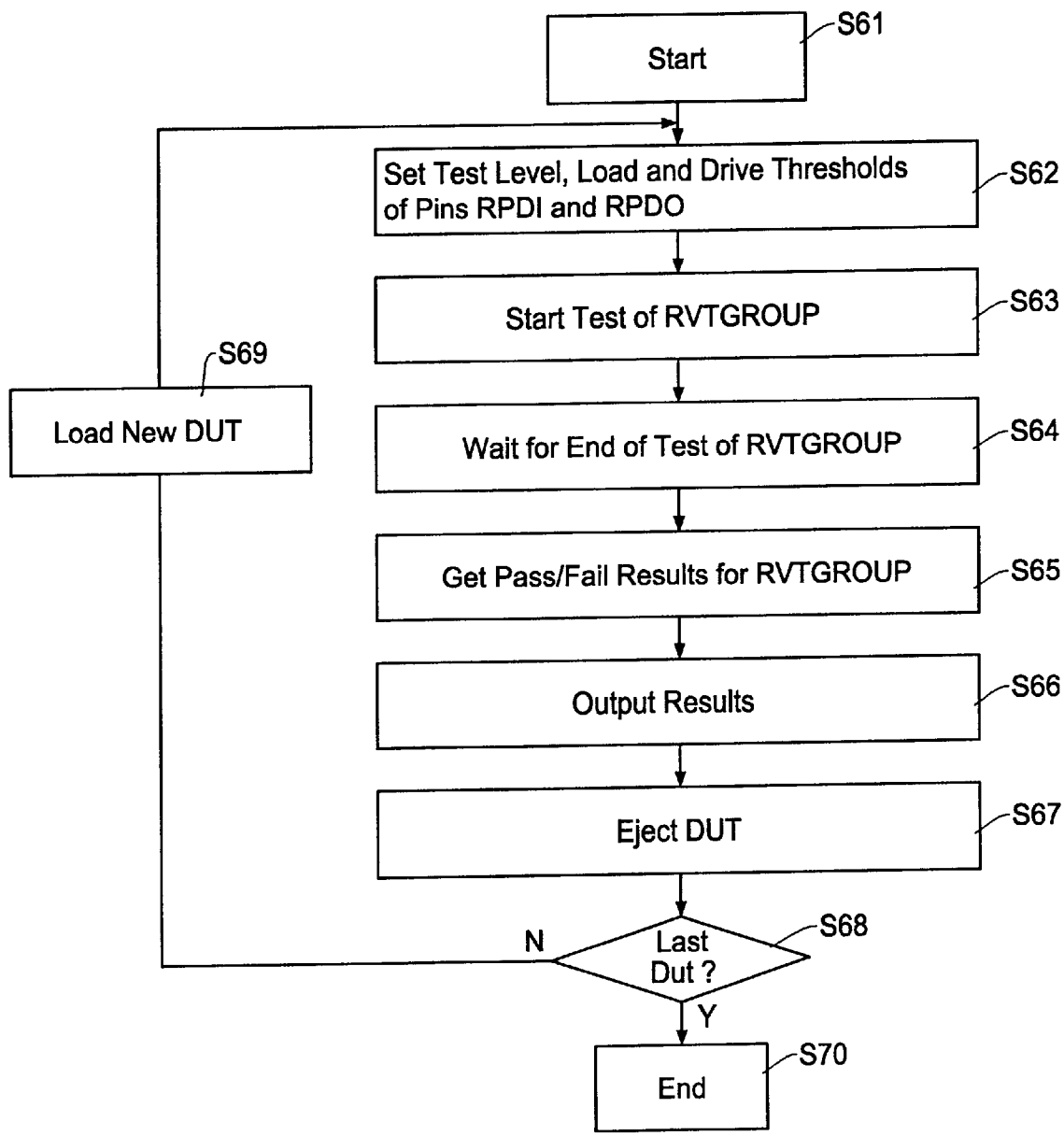
FIG. 13 is a flow chart showing a procedure for conducting the parallel testing of FIG. 10 by the virtual logic testers in the semiconductor test system of the present invention.

After setting the test plan in the process of FIG. 12, the parallel test procedure is conducted in a manner shown in the flow diagram of FIG. 13. In the example of FIG. 13, the process starts in the step S61 so that the test parameters including test levels, load and drive thresholds of pins RPDI and RPDO are set in the step S62. The test of virtual test group RVTGROUP starts in the step S63. To start all the pin-units together of the virtual test group the unique GSA (Group Selection Address) is allocated to the group. This can be done with the hardware by using correct start control word data using a group select signal, write select signal, RVTGROUP GSA address and correct unit control registers address.

In the step S64, the process waits for the virtual test group RVTGROUP tasks stop. When the virtual test group tasks stop for the DUT1–DUT3, the system receives pass/fail information for the virtual test group in the step S65. Then the process moves to the step S65 wherein the test system outputs all test results of the virtual test group RVTGROUP. In the step S66, the process commands the test handler to eject the DUT1–DUT3 from the test head. In the step S67, it is determined whether the tested DUT is the last DUT. If it is, the process ends in the step S70, if it is not, new DUTs are loaded and the process goes back to the step S62 to repeat the procedure in the steps S62–68 until all of the DUTs are tested.

As described in the foregoing, in the test system of the present invention which supports multiple virtual testers, groups test pins are dynamically allocated to separate DUTs or separate subsystems of SoC. These groups are addressed by the tester hardware separately and treated as discrete individual test systems. The group allocation and selection is accomplished through a hardware mechanism that allows the host computer to write the group selection address (GSA) on the pin-unit bus. Tests running on these virtual testers can be started together or separately and end independently. Thus, the present invention allows to test a plurality of different IC devices simultaneously on a single test system. The concept of the present invention is applicable to either the tester per-pin architecture or the pin-cluster architecture.

The semiconductor test system of the present invention can achieve the following effects:
  (1) Allow asynchronous and synchronous parallel testing of subsystems in a SOC device.
  (2) Speed tester configuration by allowing programming multiple pins-units in parallel.
  (3) Flexibility in configuration.

(4) Simplify hardware control for multiple DUT testing.

(5) Simplify software programming for a multiple DUT system.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system supporting multiple virtual testers for testing a plurality of devices in parallel, comprising:

a host computer controlling an overall operation of the test system by executing a test program;

a plurality of pin-units each having means for generating a test pattern to an assigned pin of a semiconductor device under test and evaluating a resultant response of the device under test;

a pin-unit bus provided between said host computer and said plurality of pin-units for transmitting data, address, control signals and clocks; and means for reconfiguring said pin-units either statically or dynamically with respect to groups of test pins of the semiconductor test system where an operational timing of each of the groups of the test pins is independent from one another.

2. A semiconductor test system supporting multiple virtual testers as defined in claim 1, wherein said means for reconfiguring said pin-units relative to said test pins assigns said pin-units based on a group selection address placed on said pin-unit bus by said host computer; and wherein said means for configuring said pin-units includes a pin-unit write decoder provided in each of said pin-unit for allowing said group selection address be written in a program group selection address register in a corresponding pin-unit when said register is identified by said host computer.

3. A semiconductor test system supporting multiple virtual testers as defined in claim 2, wherein said pin-unit write decoder, comprising:

means for identifying a group selection address of a pin-unit in the program group selection address register;

means for receiving group address data from the pin-unit bus indicating a group to which a target register in the pin-unit belongs to write test data therein;

means for comparing the group selection address of the pin-unit and the group address data from the pin-unit bus and generating an enable signal when there is a match therebetween; and a decoder for decoding the group address data when receiving the enable signal to write the test data in the target register in the pin-unit.

4. A semiconductor test system supporting multiple virtual testers as defined in claim 3, further including means for generating a test start signal at a timing of a master clock after grouping the pin-units.

5. A semiconductor test system supporting multiple virtual testers as defined in claim 1, wherein a plurality of different tests running on multiple virtual testers start together or separately and end independently.

6. A semiconductor test system supporting multiple virtual testers as defined in claim 1, wherein each of said pin-units is assigned to one or more test pins of the semiconductor test system wherein each of said input or output pins of the device under test is connected to corresponding one of said test pins.

7. A semiconductor test system supporting multiple virtual testers as defined in claim 1, wherein each of said pin-units is assigned to a group of test pins of the semiconductor test system wherein the number of test pins in said group is changed dynamically under the control of the host computer.

8. A semiconductor test system supporting multiple virtual testers as defined in claim 1, wherein each of said pin-units is assigned to a group of test pins of the semiconductor test system so that each pin-unit independently tests one of a plurality of devices under test at the same time.

9. A semiconductor test system supporting multiple virtual testers as defined in claim 1, wherein each of said pin-units is dynamically assigned to a group of test pins of the semiconductor test system so that each pin-unit works as an independent tester to test one of a plurality of devices under test in such a way that a test operation of one pin-unit is performed either synchronously or asynchronously with other pin-units.

10. A semiconductor test system supporting multiple virtual testers as defined in claim 1, wherein each of said pin-units is dynamically assigned to a group of test pins of the semiconductor test system so that each pin-unit works as an independent tester to test one of a plurality of devices under test in such a way that a test-operation of one pin-unit starts together or separately from other pin-units and ends separately from other pin-units.

11. A semiconductor test system supporting multiple virtual testers as defined in claim 1, further including means for generating an end of test signal from each pin-unit where each pin-unit is allocated with a group of test pins of the semiconductor test system to function as an independent tester.

12. A semiconductor test system supporting multiple virtual testers as defined in claim 11, wherein the host computer monitors the end of test signal and stops a test procedure for the pin-unit generating the end of test signal while continuing test procedures in other pin-units.

13. A semiconductor test system supporting multiple virtual testers as defined in claim 11, wherein the host computer monitors the end of test signal and changes a device under test for the pin-unit which has generated the end of test signal to start a new test therefor while continuing test procedures in other pin-units.

14. A semiconductor test system supporting multiple virtual testers as defined in claim 11, wherein the host computer monitors the end of test signal and reconfigures the grouping of the test pins for the pin-unit which has generated the end of test signal, changes a device under test for the pin-unit to start a new test therefor while continuing test procedures in other pin-units.

15. A semiconductor test system supporting multiple virtual testers as defined in claim 11, wherein said means for generating an end of test signal includes an open collector driver provided for each pin-unit to send the end of test signal to the pin-unit bus.

16. A semiconductor test system supporting multiple virtual testers for testing a plurality of devices in parallel, comprising:

a host computer controlling an overall operation of a semiconductor test system by executing a test program;

a plurality of pin-units each having means for generating a test pattern to an assigned pin of a semiconductor device under test and evaluating a resultant response of the device under test;

a pin-unit bus provided between said host computer and said plurality of pin-units for transmitting data, address, control signals and clocks;

means for configuring said pin-units statically or dynamically corresponding to test pins of the semiconductor test system when a group selection address is placed on said pin-unit bus by said host computer; and means for starting and ending a test process for each pin-unit, thereby running the pin-unit independently from other pin-units;

wherein each pin-unit tests one of the devices under test either synchronously or asynchronously with other pint-units.

* * * * *